US012813092B2

(12) United States Patent
Takahashi et al.

(10) Patent No.: US 12,813,092 B2
(45) Date of Patent: Nov. 24, 2026

(54) DISPLAY DEVICE

(71) Applicant: Magnolia White Corporation, Tokyo (JP)

(72) Inventors: Hideyuki Takahashi, Tokyo (JP); Hiroyuki Kimura, Tokyo (JP); Hiroshi Tabatake, Tokyo (JP); Tetsuo Morita, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 353 days.

(21) Appl. No.: 18/627,476

(22) Filed: Apr. 5, 2024

(65) Prior Publication Data

US 2024/0341124 A1 Oct. 10, 2024

(30) Foreign Application Priority Data

Apr. 7, 2023 (JP) ................................ 2023-062837
Jul. 10, 2023 (JP) ................................ 2023-112912

(51) Int. Cl.
*H10K 59/122* (2023.01)

(52) U.S. Cl.
CPC ................................ *H10K 59/122* (2023.02)

(58) Field of Classification Search
CPC ........................... H10K 59/122; H10K 59/131
See application file for complete search history.

(56) References Cited

U.S. PATENT DOCUMENTS

2004/0160170 A1 8/2004 Sato et al.
2009/0009069 A1 1/2009 Takata
2019/0363275 A1 11/2019 Ochi et al.
2022/0077251 A1 3/2022 Choung et al.
2022/0158117 A1* 5/2022 Chang .................. H10K 59/121
2022/0285465 A1* 9/2022 Kang .................... H10W 90/00
2023/0189602 A1* 6/2023 Qin ...................... H10K 59/122 257/40
2024/0122021 A1* 4/2024 Yoo ........................ H10K 59/60
2024/0130168 A1* 4/2024 Kang ..................... H10K 59/00
2024/0224711 A1* 7/2024 Lee ...................... H10K 59/124
2024/0268153 A1* 8/2024 Lee ........................ H10K 59/40
2024/0292666 A1* 8/2024 Shin ..................... H10K 59/122

FOREIGN PATENT DOCUMENTS

JP 2000-195677 A 7/2000
JP 2004-207217 A 7/2004
JP 2008-135325 A 6/2008
JP 2009-032673 A 2/2009
JP 2010-118191 A 5/2010
WO 2018/179308 A1 10/2018

* cited by examiner

*Primary Examiner* — Mamadou L Diallo
(74) *Attorney, Agent, or Firm* — XSENSUS LLP

(57) ABSTRACT

According to one embodiment, a display device includes first to third pixels arranged in a first direction, and a partition surrounding the pixels. The partition includes a first partition between the first and second pixels extending in a second direction along the first pixel, a second partition between the first and second pixels extending in the second direction along the second pixel, and a third partition between the second and third pixels extending in the second direction. The first and second partitions are spaced apart from each other in the first direction via a slit. The third partition is continuously formed between the second and third pixels.

20 Claims, 15 Drawing Sheets

DISPLAY DEVICE

CROSS-REFERENCE TO RELATED APPLICATIONS

This application is based upon and claims the benefit of priority from Japanese Patent Applications No. 2023-062837, filed Apr. 7, 2023; and No. 2023-112912, filed Jul. 10, 2023, the entire contents of all of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer. Common voltage is applied to the upper electrode of each display element through lines provided in a display area. These upper electrodes and lines constitute a common electrode which overlaps the display area as a whole.

In some cases, an antenna which transmits and receives radio waves for near field communication (NFC) is incorporated into an electronic device comprising a display device in a state where the antenna overlaps the display device. In this case, eddy current could occur in a common electrode because of a magnetic field generated by the antenna. If the resistance of the common electrode is low, the magnetic field generated by eddy current becomes strong and may be a cause of interruption of communication performed by the antenna.

In addition, translucency is required in some display devices. However, if the above lines are formed of a material having light-shielding properties such as metal, the translucency of the display device could be considerably decreased.

DETAILED DESCRIPTION

Figure 1:
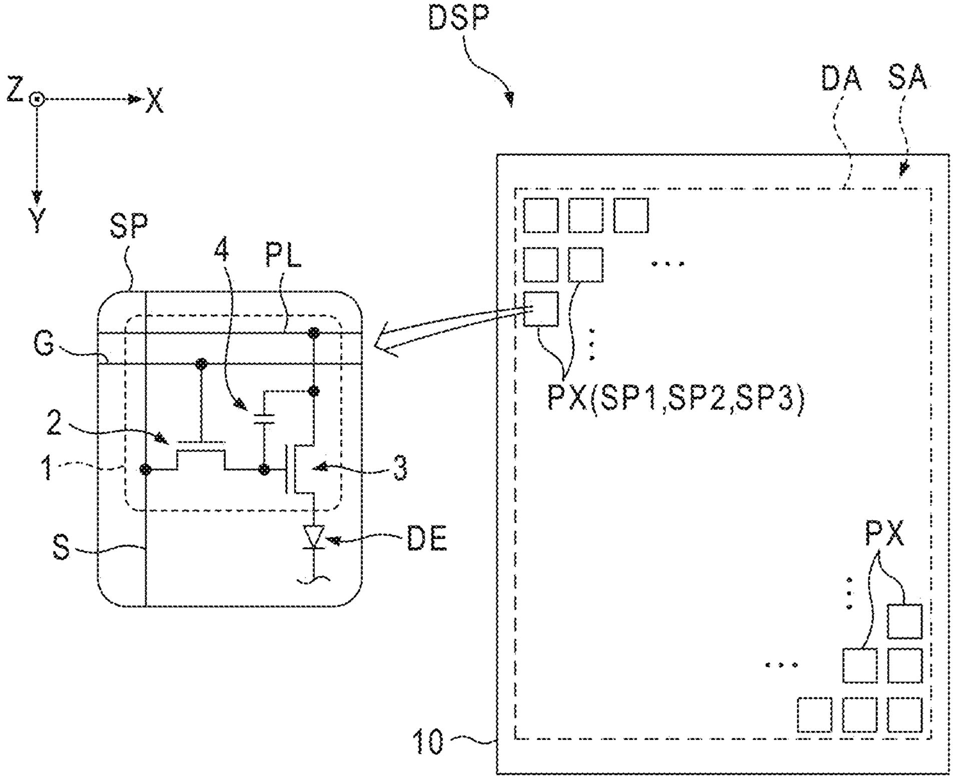
FIG. 1 is a diagram showing a configuration example of a display device according to a first embodiment.

In general, according to one embodiment, a display device comprises first, second and third pixels each of which includes a plurality of subpixels exhibiting different colors, and which are arranged in a first direction, and a partition which includes a conductive lower portion and an upper portion protruding from a side surface of the lower portion and surrounds each of the first pixel, the second pixel and the third pixel. Each of the subpixels includes a lower electrode, an organic layer which covers the lower electrode and emits light based on application of voltage, and an upper electrode which is in contact with the lower portion and covers the organic layer. The partition includes a first partition located between the first pixel and the second pixel and extending in a second direction intersecting with the first direction along the first pixel, a second partition located between the first pixel and the second pixel and extending in the second direction along the second pixel, and a third partition located between the second pixel and the third pixel and extending in the second direction. The first partition and the second partition are spaced apart from each other in the first direction via a slit extending in the second direction. The third partition is continuously formed between the second pixel and the third pixel.

The embodiment can provide a display device comprising an improved interconnection structure.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as an X-direction. A direction parallel to the Y-axis is referred to as a Y-direction. A direction parallel to the Z-axis is referred to as a Z-direction. The Z-direction is a normal direction relative to a plane including the X-direction and the Y-direction. When various elements are viewed parallel to the Z-direction, the appearance is defined as a plan view.

The display device of each embodiment is an organic electroluminescent display device comprising an organic light emitting diode (OLED) as a display element, and could be mounted on various types of electronic devices such as a television, a personal computer, a vehicle-mounted device, a tablet, a smartphone, a mobile phone and a wearable terminal.

First Embodiment

FIG. 1 is a diagram showing a configuration example of a display device DSP according to a first embodiment. The display device DSP comprises an insulating substrate 10. The substrate 10 has a display area DA which displays an image, and a surrounding area SA around the display area DA. The substrate 10 may be glass or a resinous film having flexibility.

In the present embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in an X-direction and a Y-direction. Each pixel PX includes a plurality of subpixels SP. For example, each pixel PX includes a blue subpixel SP1, a green subpixel SP2 and a red subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of a thin-film transistor.

In the display area DA, a plurality of scanning lines G which supply a scanning signal to the pixel circuit 1 of each subpixel SP, a plurality of signal lines S which supply a video signal to the pixel circuit 1 of each subpixel SP and a plurality of power lines PL are provided. In the example of FIG. 1, the scanning lines G and the power lines PL extend in the X-direction, and the signal lines S extend in the Y-direction.

The gate electrode of the pixel switch 2 is connected to the scanning line G. One of the source electrode and drain electrode of the pixel switch 2 is connected to the signal line S. The other one is connected to the gate electrode of the drive transistor 3 and the capacitor 4. In the drive transistor 3, one of the source electrode and the drain electrode is connected to the power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

Figure 2:
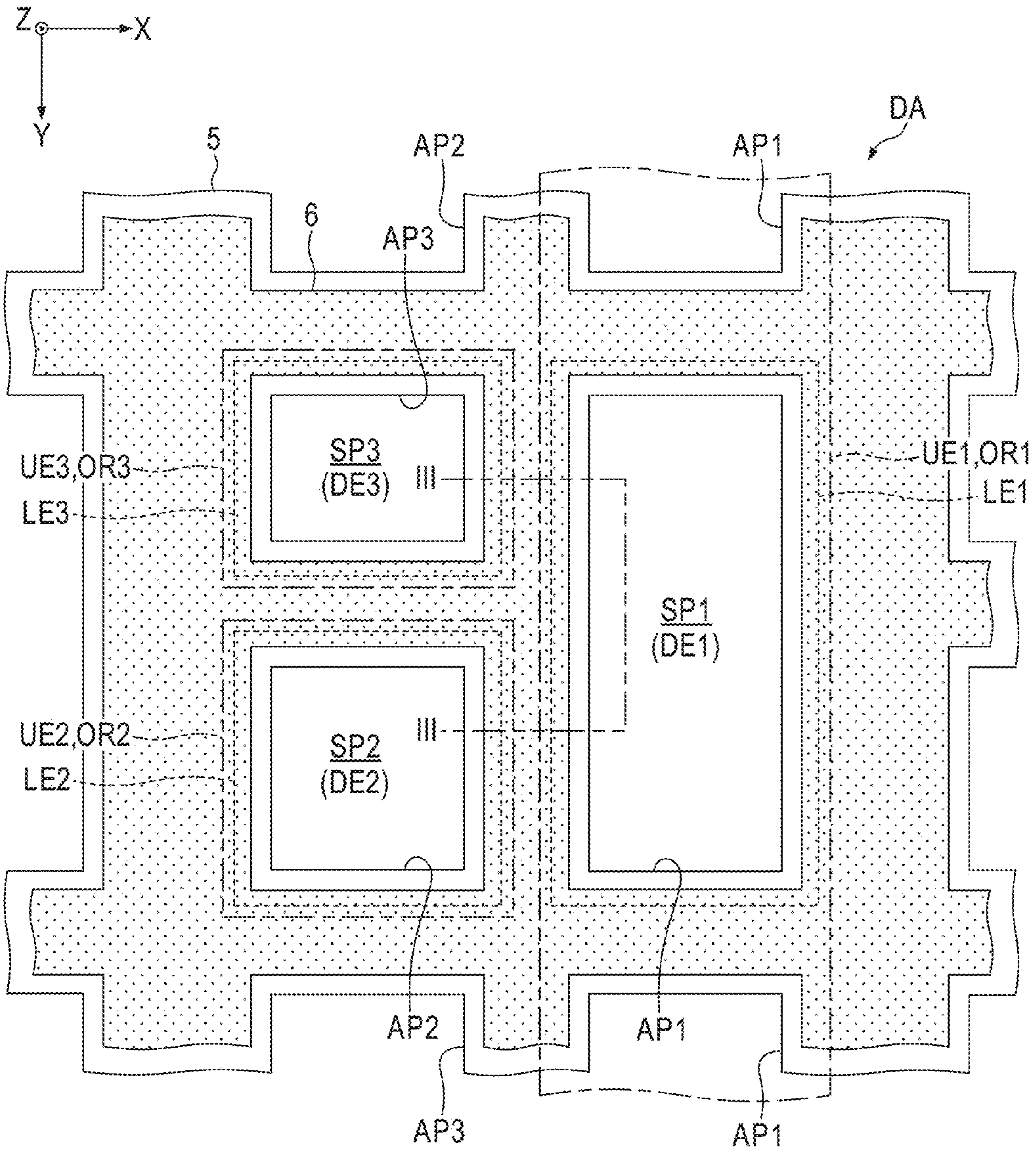
FIG. 2 is a schematic plan view showing an example of the layout of subpixels.

FIG. 2 is a schematic plan view showing an example of the layout of subpixels SP1, SP2 and SP3. In the example of FIG. 2, each of subpixels SP2 and SP3 is adjacent to subpixel SP1 in the X-direction. Further, subpixels SP2 and SP3 are arranged in the Y-direction.

When subpixels SP1, SP2 and SP3 are provided in line with this layout, in the display area DA, a column in which subpixels SP2 and SP3 are alternately provided in the Y-direction and a column in which a plurality of subpixels SP1 are repeatedly provided in the Y-direction are formed. These columns are alternately arranged in the X-direction. It should be noted that the layout of subpixels SP1, SP2 and SP3 is not limited to the example of FIG. 2.

A rib 5 is provided in the display area DA. The rib 5 has pixel apertures AP1, AP2 and AP3 in subpixels SP1, SP2 and SP3, respectively. In the example of FIG. 2, the pixel aperture AP1 is larger than the pixel aperture AP2. The pixel aperture AP2 is larger than the pixel aperture AP3.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3.

Of the lower electrode LE1, the upper electrode UE1 and the organic layer OR1, the portions which overlap the pixel aperture AP1 constitute the display element DE1 of subpixel SP1. Of the lower electrode LE2, the upper electrode UE2 and the organic layer OR2, the portions which overlap the pixel aperture AP2 constitute the display element DE2 of subpixel SP2. Of the lower electrode LE3, the upper electrode UE3 and the organic layer OR3, the portions which overlap the pixel aperture AP3 constitute the display element DE3 of subpixel SP3. Each of the display elements DE1, DE2 and DE3 may further include a cap layer as described later. The rib 5 surrounds each of these display elements DE1, DE2 and DE3.

A conductive partition 6 is provided on the rib 5. The partition 6 overlaps the rib 5 as a whole and has the same planar shape as the rib 5. In other words, the partition 6 has an aperture in each of subpixels SP1, SP2 and SP3. From another viewpoint, each of the rib 5 and the partition 6 has a grating shape as seen in plan view and surrounds each of subpixels SP1, SP2 and SP3.

Figure 3:
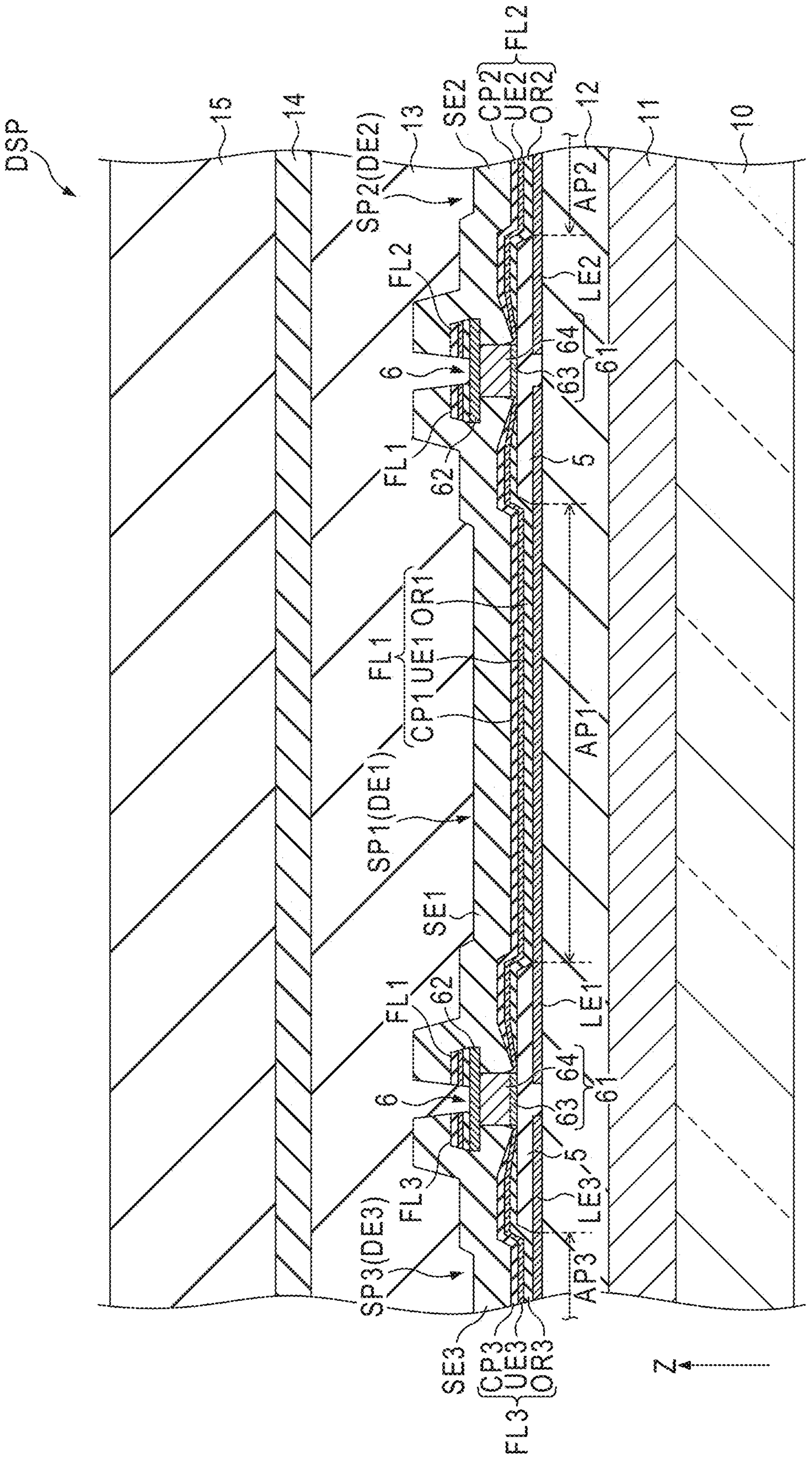
FIG. 3 is a schematic cross-sectional view of the display device along the III-III line of FIG. 2.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuits 1, scanning lines G, signal lines S and power lines PL shown in FIG. 1. The circuit layer 11 is covered with an organic insulating layer 12. The organic insulating layer 12 functions as a planarization film which planarizes the irregularities formed by the circuit layer 11.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5. Although not shown in the section of FIG. 3, the lower electrodes LE1, LE2 and LE3 are connected to the respective pixel circuits 1 of the circuit layer 11 through respective contact holes provided in the organic insulating layer 12.

The partition 6 includes a conductive lower portion 61 provided on the rib 5 and an upper portion 62 provided on the lower portion 61. The upper portion 62 has a width greater than that of the lower portion 61. By this configuration, the both end portions of the upper portion 62 protrude relative to the side surfaces of the lower portion 61. This shape of the partition 6 is called an overhang shape.

In the example of FIG. 3, the lower portion 61 has a bottom portion 63 provided on the rib 5, and a stem portion 64 provided on the bottom portion 63. The bottom portion 63 is formed so as to be thinner than the stem portion 64. In the example of FIG. 3, the side surfaces of the bottom portion 63 and the stem portion 64 are aligned with each other. However, the both end portions of the bottom portion 63 may protrude from the side surfaces of the stem portion 64.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3. The upper electrodes UE1, UE2 and UE3 are in contact with the side surfaces of the lower portion 61 of the partition 6.

The display element DE1 includes a cap layer CP1 provided on the upper electrode UE1. The display element DE2 includes a cap layer CP2 provided on the upper electrode UE2. The display element DE3 includes a cap layer CP3 provided on the upper electrode UE3. The cap layers CP1, CP2 and CP3 function as optical adjustment layers which improve the extraction efficiency of the light emitted from the organic layers OR1, OR2 and OR3, respectively.

In the following explanation, a multilayer body including the organic layer OR1, the upper electrode UE1 and the cap layer CP1 is called a stacked film FL1. A multilayer body including the organic layer OR2, the upper electrode UE2 and the cap layer CP2 is called a stacked film FL2. A multilayer body including the organic layer OR3, the upper electrode UE3 and the cap layer CP3 is called a stacked film FL3.

The stacked film FL1 is partly located on the upper portion 62. This portion is spaced apart from, of the stacked film FL1, the portion located under the partition 6 (in other words, the portion which constitutes the display element DE1). Similarly, the stacked film FL2 is partly located on the upper portion 62. This portion is spaced apart from, of the stacked film FL2, the portion located under the partition 6 (in other words, the portion which constitutes the display element DE2). Further, the stacked film FL3 is partly located on the upper portion 62. This portion is spaced apart from, of the stacked film FL3, the portion located under the partition 6 (in other words, the portion which constitutes the display element DE3).

Sealing layers SE1, SE2 and SE3 are provided in subpixels SP1, SP2 and SP3, respectively. The sealing layer SE1 continuously covers the stacked film FL1 and the partition 6 around subpixel SP1. The sealing layer SE2 continuously covers the stacked film FL2 and the partition 6 around subpixel SP2. The sealing layer SE3 continuously covers the stacked film FL3 and the partition 6 around subpixel SP3.

In the example of FIG. 3, the stacked film FL1 and sealing layer SE1 located on the partition 6 between subpixels SP1 and SP2 are spaced apart from the stacked film FL2 and sealing layer SE2 located on this partition 6. The stacked film FL1 and sealing layer SE1 located on the partition 6 between subpixels SP1 and SP3 are spaced apart from the stacked film FL3 and sealing layer SE3 located on this partition 6.

The sealing layers SE1, SE2 and SE3 are covered with a resin layer 13. The resin layer 13 is covered with a sealing layer 14. The sealing layer 14 is covered with a resin layer 15. The resin layers 13 and 15 and the sealing layer 14 are continuously provided in at least the entire display area DA and partly extend in the surrounding area SA as well.

A cover member such as a polarizer, a touch panel, a protective film or a cover glass may be further provided above the resin layer 15. This cover member may be attached to the resin layer 15 via, for example, an adhesive layer such as an optical clear adhesive (OCA).

The organic insulating layer 12 is formed of an organic insulating material such as polyimide. Each of the rib 5 and the sealing layers 14, SE1, SE2 and SE3 is formed of an inorganic insulating material such as silicon nitride (SiNx), silicon oxide (Siox), silicon oxynitride (SiON) or aluminum oxide ($Al_2O_3$). For example, the rib 5 is formed of silicon oxynitride, and each of the sealing layers 14, SE1, SE2 and SE3 is formed of silicon nitride. Each of the resin layers 13 and 15 is formed of, for example, a resinous material (organic insulating material) such as epoxy resin or acrylic resin.

Each of the lower electrodes LE1, LE2 and LE3 has a reflective layer formed of, for example, silver (Ag), and a pair of conductive oxide layers covering the upper and lower surfaces of the reflective layer. Each conductive oxide layer may be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. Each of the organic layers OR1, OR2 and OR3 may comprise a tandem structure including a plurality of light emitting layers.

Each of the cap layers CP1, CP2 and CP3 comprises, for example, a multilayer structure in which a plurality of transparent thin films are stacked. The thin films may include a thin film formed of an inorganic material and a thin film formed of an organic material. These thin films have refractive indices different from each other. For example, the refractive indices of these thin films are different from the refractive indices of the upper electrodes UE1, UE2 and UE3 and the refractive indices of the sealing layers SE1, SE2 and SE3. It should be noted that at least one of the cap layers CP1, CP2 and CP3 may be omitted.

Each of the bottom portion 63 and stem portion 64 of the partition 6 is formed of a metal material. For the metal material of the bottom portion 63, for example, molybdenum (Mo), titanium nitride (TiN), a molybdenum-tungsten alloy (MoW) or a molybdenum-niobium alloy (MoNb) can be used. For the metal material of the stem portion 64, for example, aluminum, an aluminum-neodymium alloy (AlNd), an aluminum-yttrium alloy (AlY) or an aluminum-silicon alloy (AlSi) can be used. It should be noted that the stem portion 64 may be formed of an insulating material.

For example, the upper portion 62 of the partition 6 comprises a multilayer structure consisting of a lower layer formed of a metal material and an upper layer formed of conductive oxide. For the metal material forming the lower layer, for example, titanium, titanium nitride, molybdenum, tungsten, a molybdenum-tungsten alloy or a molybdenum-niobium alloy can be used. For the conductive oxide forming the upper layer, for example, ITO or IZO can be used. It should be noted that the upper portion 62 may comprise a single-layer structure of a metal material. The upper portion 62 may further include a layer formed of an insulating material.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively, based on the video signals of the signal lines S.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including quantum dots which generate light exhibiting colors corresponding to subpixels SP1, SP2 and SP3 by the excitation caused by the light emitted from the light emitting layers.

Figure 4:
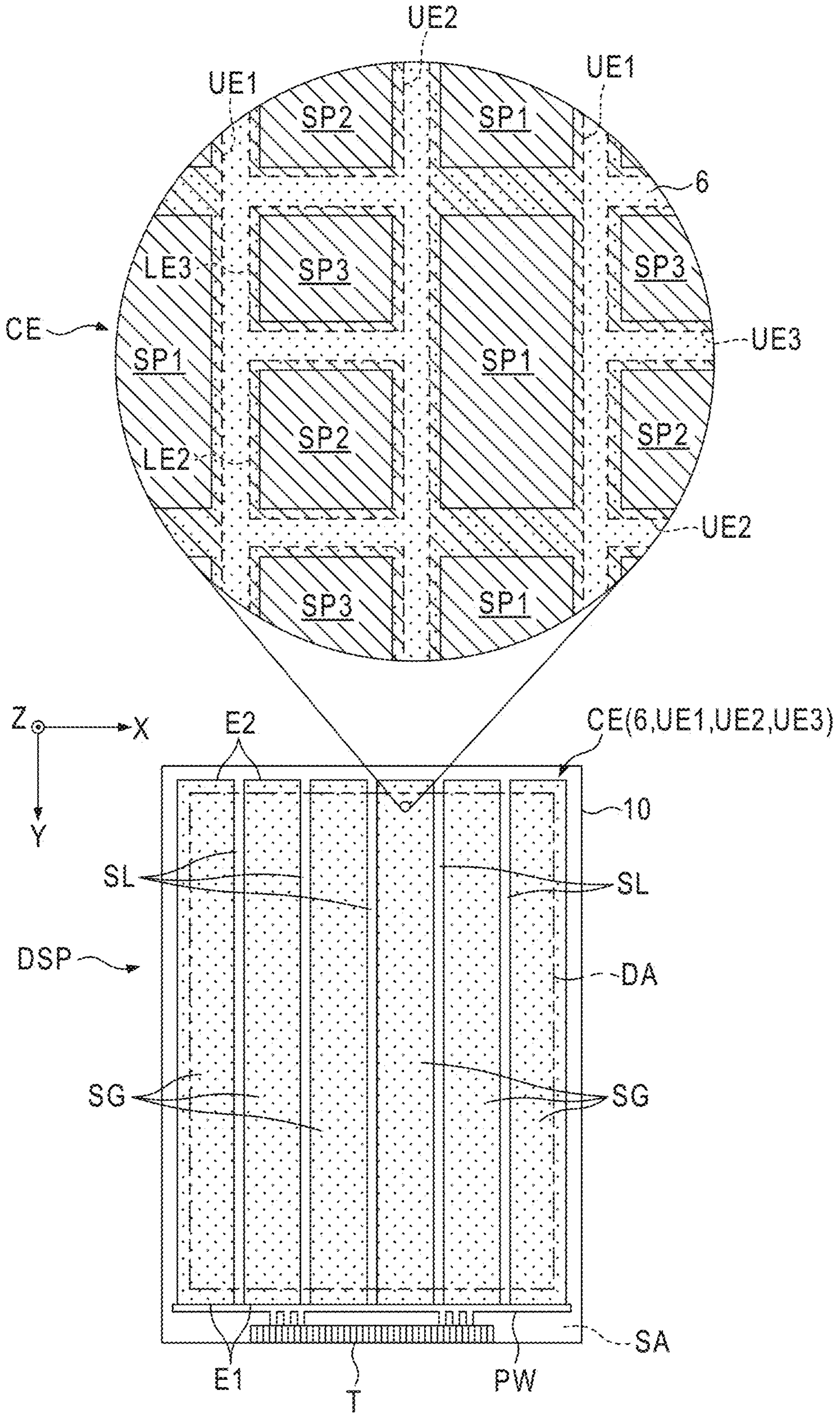
FIG. 4 is a schematic plan view showing some elements of the display device.

FIG. 4 is a schematic plan view showing some elements of the display device DSP. The partition 6 and the upper electrodes UE1, UE2 and UE3 constitute a common electrode CE which applies common voltage to the display elements DE1, DE2 and DE3. As shown in the enlarged view of FIG. 4, the upper electrodes UE1, UE2 and UE3 are provided in subpixels SP1, SP2 and SP3 included in the display area DA, and further, the partition 6 is provided in the gaps of the upper electrodes UE1, UE2 and UE3. Thus, the common electrode CE overlaps the display area DA as a whole.

A terminal portion T including a plurality of pads is provided in the surrounding area SA. A flexible printed circuit (FPC) is connected to the terminal portion T via, for example, a conductive adhesive material. Voltage and signals necessary for image display are supplied through these flexible printed circuit and terminal portion T.

Further, a power supply line PW is provided in the surrounding area SA. Common voltage is applied to the power supply line PW from the terminal portion T. In the example of FIG. 4, the power supply line PW extends in the X-direction between the terminal portion T and the display area DA.

The common electrode CE has slits SL in which at least an end reaches the outer edge of the common electrode CE (the outline in plan view). In the example of FIG. 4, the common electrode CE has five slits SL. However, the number of slits SL is not limited to this example.

In the example of FIG. 4, the both ends of each slit SL reach the outer edge of the common electrode CE. By this configuration, the common electrode CE is divided into six segments SG which are spaced apart from each other via the slits SL.

Each slit SL extends in the Y-direction. From another viewpoint, each slit SL extends parallel to the signal lines S shown in FIG. 1. The intervals of the slits SL in the X-direction are, for example, constant. In this case, the widths of the segments SG in the X-direction are equal to each other.

Each segment SG has a first end portion E1 and a second end portion E2 in the Y-direction (the extension direction of the slits SL). The first end portion E1 of each segment SG is connected to the power supply line PW. Thus, the segments SG are electrically connected to each other via the power supply line PW. The second end portions E2 of the segments SG are spaced apart from each other via the slits SL and are not connected by a conductive member such as the power supply line PW.

Figure 5:
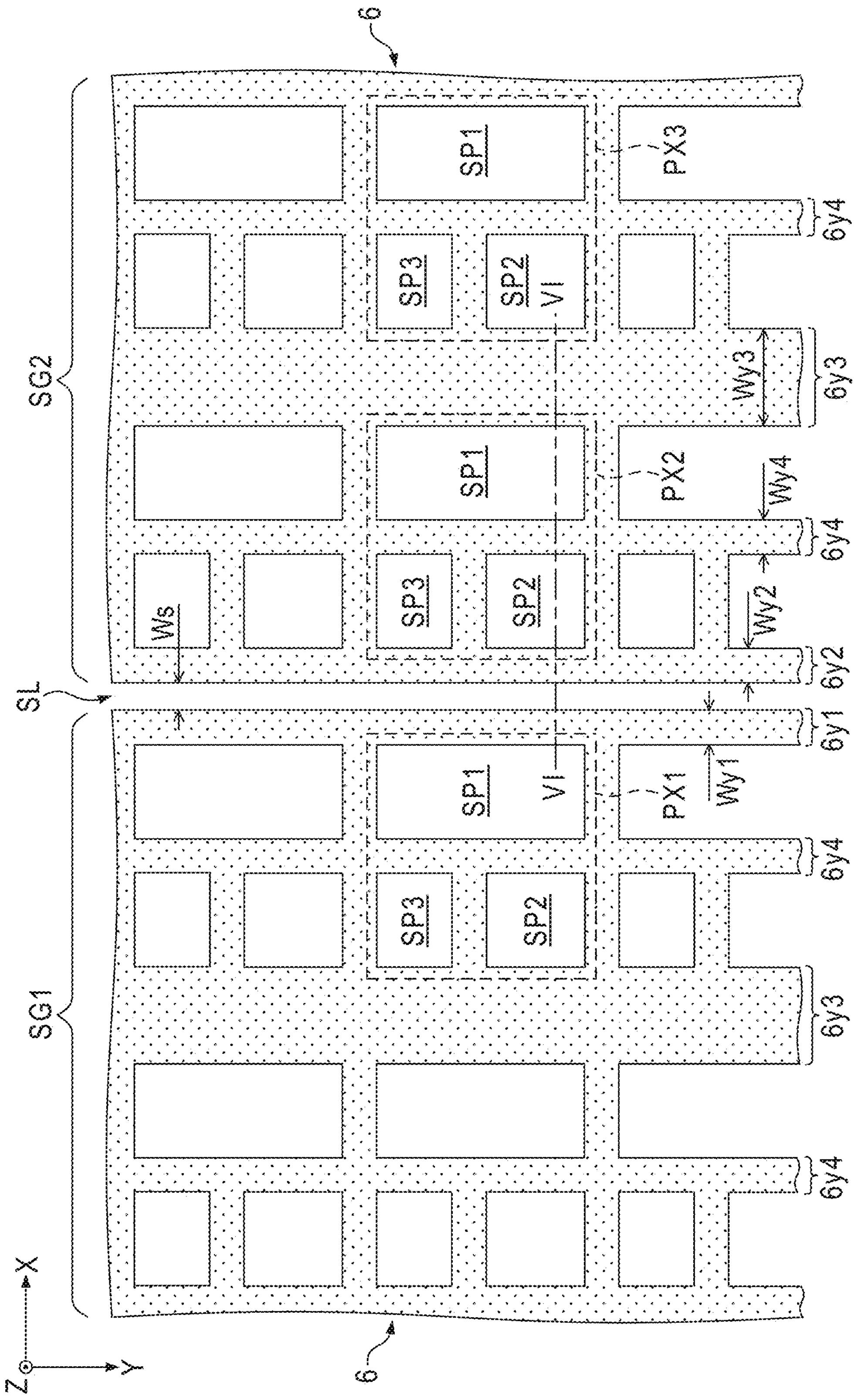
FIG. 5 is a schematic plan view in which two segments which are adjacent to each other via a slit are enlarged.

FIG. 5 is a schematic plan view in which two segments SG which are adjacent to each other via a slit SL are enlarged. In the following explanation, the segment SG located on the left side of the slit SL in FIG. 5 is called a first segment SG1, and the segment SG located on the right side is called a second segment SG2.

In the first segment SG1, a pixel PX which is adjacent to the slit SL is called a first pixel PX1. In the second segment SG2, two pixels PX which are aligned with pixel PX1 in the X-direction are called a second pixel PX2 and a third pixel PX3. Each of pixels PX1, PX2 and PX3 includes subpixels SP1, SP2 and SP3 and is surrounded by the partition 6.

The slit SL is located between each subpixel SP1 of the first segment SG1 and subpixels SP2 and SP3 of the second segment SG2. These subpixels SP1, SP2 and SP3 which are adjacent to the slit SL are surrounded by the partition 6 in a manner similar to that of the other subpixels SP1, SP2 and SP3 which are not adjacent to the slit SL.

The partition 6 includes first and second partitions **6*y*1 and 6*y*2 located between the first pixel PX1 and the second pixel PX2, and a third partition 6*y*3 located between the second pixel PX2 and the third pixel PX3. The first partition 6*y*1 extends in the Y-direction along the first pixel PX1. The second partition 6*y*2 extends in the Y-direction along the second pixel PX2. The first partition 6*y*1 and the second partition 6*y*2 are spaced apart from each other in the X-direction via the slit SL. The third partition 6*y*3 extends in the Y-direction between the second pixel PX2 and the third pixel PX3. The third partition 6*y*3 is continuously formed in the X-direction between the second pixel PX2 and the third pixel PX3** without being divided by any slit.

The partition 6 further includes a plurality of fourth partitions **6*y*4 extending in the Y-direction. In each of pixels PX1, PX2 and PX3, the fourth partition 6*y*4 is located between subpixel SP1 and subpixels SP2 and SP3. The fourth partitions 6*y*4 are not divided by any slit in a manner similar to that of the third partition 6*y*3**.

In the X-direction, the first partition **6*y*1 has width Wy1, and the second partition 6*y*2 has width Wy2, and the third partition 6*y*3 has width Wy3, and each fourth partition 6*y*4 has width Wy4, and the slit SL has width Ws. Here, widths Wy1, Wy2, Wy3 and Wy4 are the widths of the upper portions 62 of the partitions 6*y*1, 6*y*2, 6*y*3 and 6*y*4, respectively, in the X-direction. Width Ws is the distance between the end portions of the upper portions 62** of the partitions 6*y*1 and 6*y*2 in the X-direction. In the embodiment, width Wy3 is greater than each of widths Wy1, Wy2 and Wy4 (Wy1, Wy2, Wy4<Wy3). Widths Wy1, Wy2 and Wy4 are, for example, equal to each other.

Further, in this embodiment, width Wy3 is equal to the total width of the first partition 6*y*1, the second partition 6*y*2 and the slit SL (Wy1+Wy2+Ws=Wy3). By this configuration, the interval between pixels PX1 and PX2 in the X-direction is coincident with the interval between pixels PX2 and PX3 in the X-direction.

In the example of FIG. 5, width Ws is less than each of widths Wy1, Wy2, Wy3 and Wy4 (Ws<Wy1, Wy2, Wy3, Wy4). However, width Ws may be equal to at least one of widths Wy1, Wy2 and Wy4 or may be greater than at least one of widths Wy1, Wy2 and Wy4.

Figure 6:
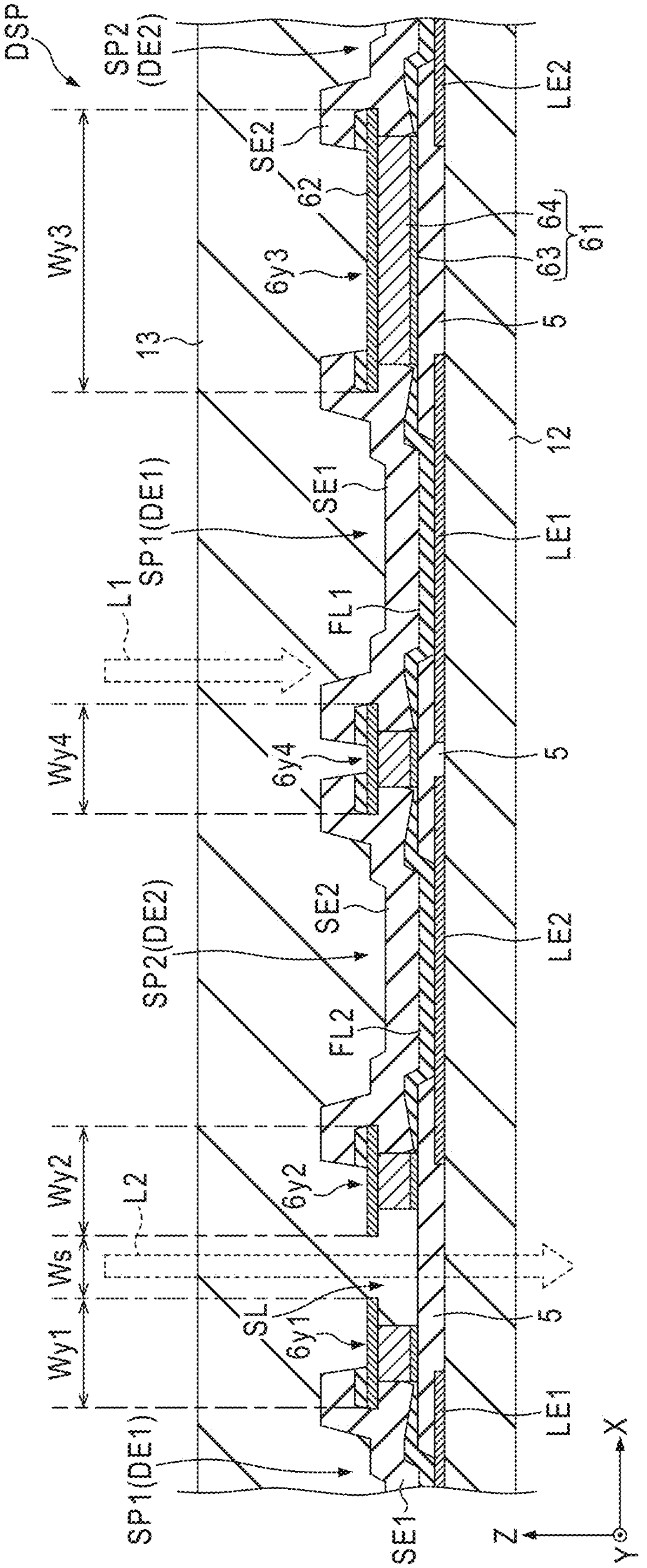
FIG. 6 is a schematic cross-sectional view of the display device along the VI-VI line of FIG. 5.

FIG. 6 is a schematic cross-sectional view of the display device DSP along the VI-VI line of FIG. 5. In this figure, the illustrations of the substrate 10, the circuit layer 11, the sealing layer 14 and the resin layer 15 are omitted.

Each of the partitions 6*y*1, 6*y*2, 6*y*3 and 6*y*4 has the lower portion 61 (the bottom portion 63 and the stem portion 64) described above, and the upper portion 62 which protrudes from the side surfaces of the lower portion 61. Neither the lower portion 61 nor the upper portion 62 is provided in the slit SL. In other words, in the slit SL, the upper surface of the rib 5 is exposed from the partition 6.

Further, none of the stacked films FL1, FL2 and FL3 and the sealing layers SE1, SE2 and SE3 is provided in the slit SL. In the example of FIG. 6, the slit SL is filled with the resin layer 13.

Here, examples of the effects obtained from the present embodiment are explained.

Figure 7:
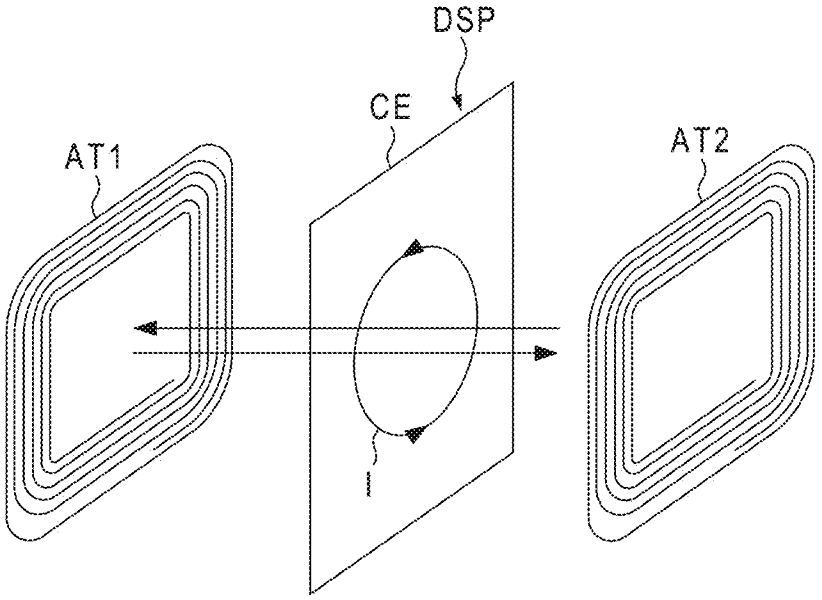
FIG. 7 is a diagram for explaining the effect of the display device according to the first embodiment.
Figure 8:
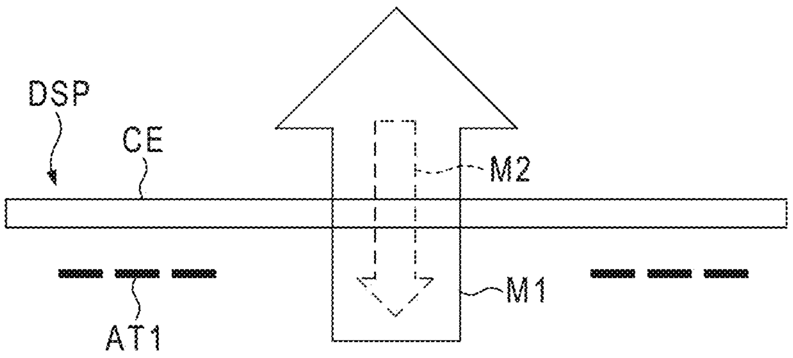
FIG. 8 is a diagram for explaining the effect of the display device according to the first embodiment.

FIG. 7 and FIG. 8 are diagrams for explaining the effect of the display device DSP according to the embodiment. An electronic device on which the display device DSP is mounted may comprise an antenna AT1 for near field communication (NFC). The antenna AT1 is provided so as to, for example, face the rear side of the display device DSP (in other words, the lower surface of the substrate 10 shown in FIG. 3) and wirelessly communicates with the antenna AT2 of another electronic device through the display device DSP.

At the time of wireless communication between the antennas AT1 and AT2, eddy current I is generated in the common electrode CE by magnetic field M1 formed by the antenna AT1. By eddy current I, magnetic field M2 which negates magnetic field M1 is formed, and the signal strength is attenuated. Thus, when wireless communication is performed via the display device DSP, the communication sensitivity could be decreased. In particular, when a partition 6 mainly formed of a metal material and having a grating shape is formed in the entire display area DA, the resistance of the common electrode CE is low. Thus, a large eddy current I occurs, thereby generating a strong magnetic field M2. Thus, the communication sensitivity is easily decreased.

To the contrary, in the embodiment, the common electrode CE is divided into a plurality of segments SG by the slits SL. In this case, a large eddy current is not easily generated in the common electrode CE. Thus, the decrease in communication sensitivity can be prevented. Eddy current could be generated in each segment SG. However, the effect caused to communication sensitivity by this eddy current is tiny compared to eddy current I generated in the entire part of a common electrode CE which is not divided.

Electronic devices on which the display device DSP is mounted may comprise an optical sensor such as an illumination sensor which detects external light. When such an optical sensor is provided on the rear side of the display device DSP, translucency is required in the display device DSP.

However, each of the lower electrodes LE1, LE2 and LE3 includes the reflective layer described above. In addition, the partition 6 which is at least partly formed of a metal material has light-shielding properties. For this reason, as in the case of external light L1 shown in FIG. 6, the light which is made incident on the display surface of the display device DSP could be mostly reflected or blocked without being transmitted to the rear side.

To the contrary, when the slit SL is provided in the partition 6 like the embodiment, as in the case of external light L2 shown in FIG. 6, part of the light which is made incident on the display surface is transmitted to the rear side of the display device DSP through the slit SL. By this configuration, the translucency of the display device DSP can be enhanced.

Moreover, in the embodiment, width Wy3 of the partition 6*y*3 provided between pixels PX2 and PX3 which are adjacent to each other without an intervention of any slit SL is greater than widths Wy1 and Wy2 of the partitions 6*y*1 and 6*y*2 provided between pixels PX1 and PX2 which are adjacent to each other via the slit SL. This configuration prevents the change in the pitch of the pixels PX in an area near the slit SL and an area distant from the slit SL in the X-direction. Thus, the display quality can be improved. When, as shown in FIG. 5, width Wy3 is equal to the total width (Wy1+Wy2+Ws) of the first partition 6*y*1, the second partition 6*y*2 and the slit SL, the pitch of the pixels PX in the Y-direction is constant in the entire display area DA. Thus, this configuration is more desirable.

It should be noted that the partition 6 functions as lines for supplying electricity to the upper electrodes UE1, UE2 and UE3 and also functions to divide the stacked films FL1, FL2 and FL3 which are formed by vapor deposition when the display device DSP is manufactured. By dividing the stacked films FL1, FL2 and FL3 in this manner, the display elements DE1, DE2 and DE3 which are individually sealed by the sealing layers SE1, SE2 and SE3 can be obtained.

If a subpixel which is not surrounded by the partition 6 is generated by providing the slit SL, the stacked film of the subpixel cannot be completely divided by the partition 6. In this case, a sealing failure of the display element could be caused in the subpixel SP.

To the contrary, in the embodiment, all of subpixels SP1, SP2 and SP3 which are adjacent to the slit SL are surrounded by the partition 6. By this configuration, the display elements DE1, DE2 and DE3 can be individually sealed in subpixels SP1, SP2 and SP3 which are adjacent to the slit SL.

The configuration disclosed in the present embodiment could be modified in various ways. The second to sixth embodiments described below disclose other examples of a configuration which could be applied to the partition 6 and the common electrode CE. The configurations and effects which are not particularly referred to in these embodiments are the same as those of the first embodiment.

Second Embodiment

Figure 9:
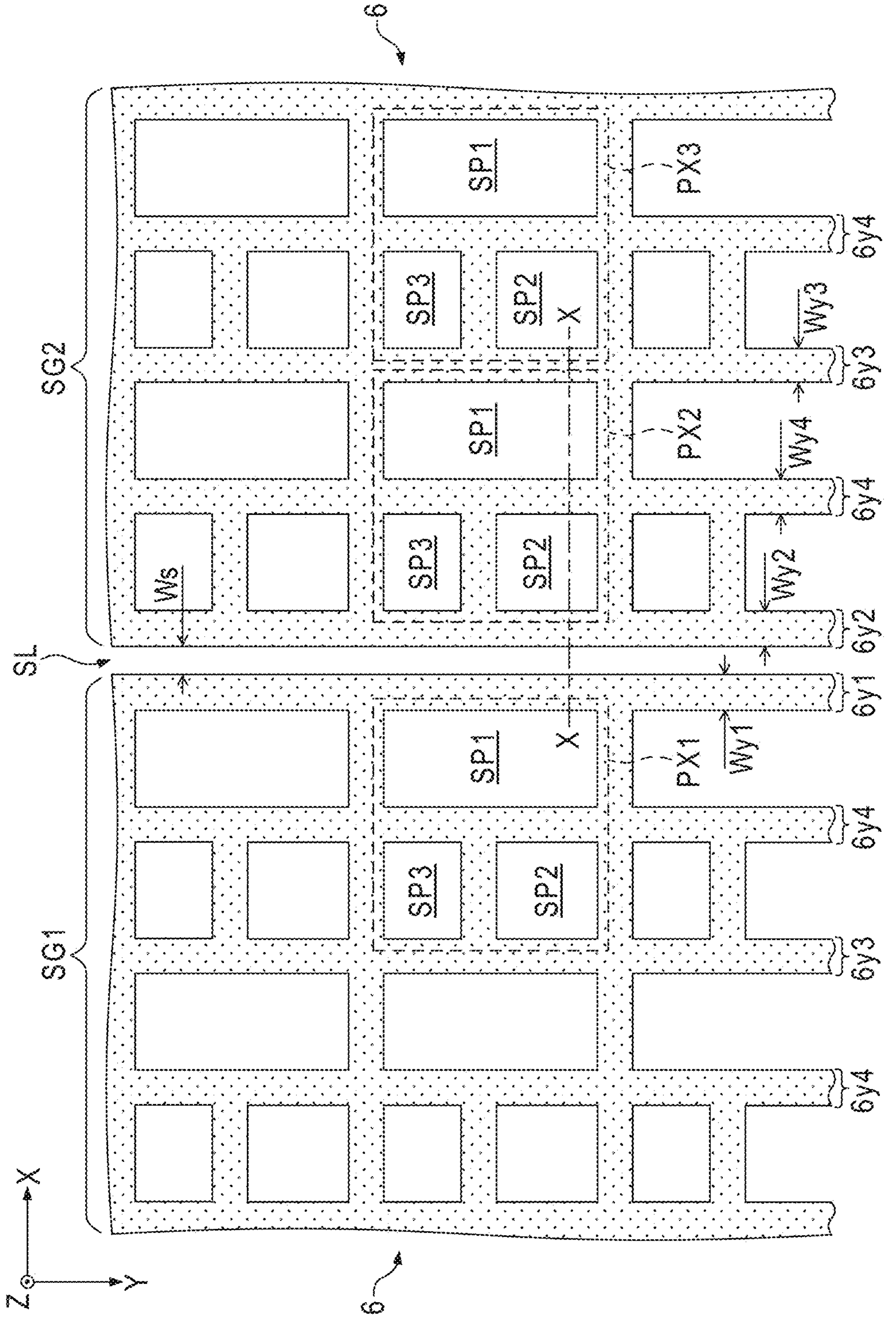
FIG. 9 is a schematic plan view in which two segments which are adjacent to each other via a slit are enlarged in a display device according to a second embodiment.
Figure 10:
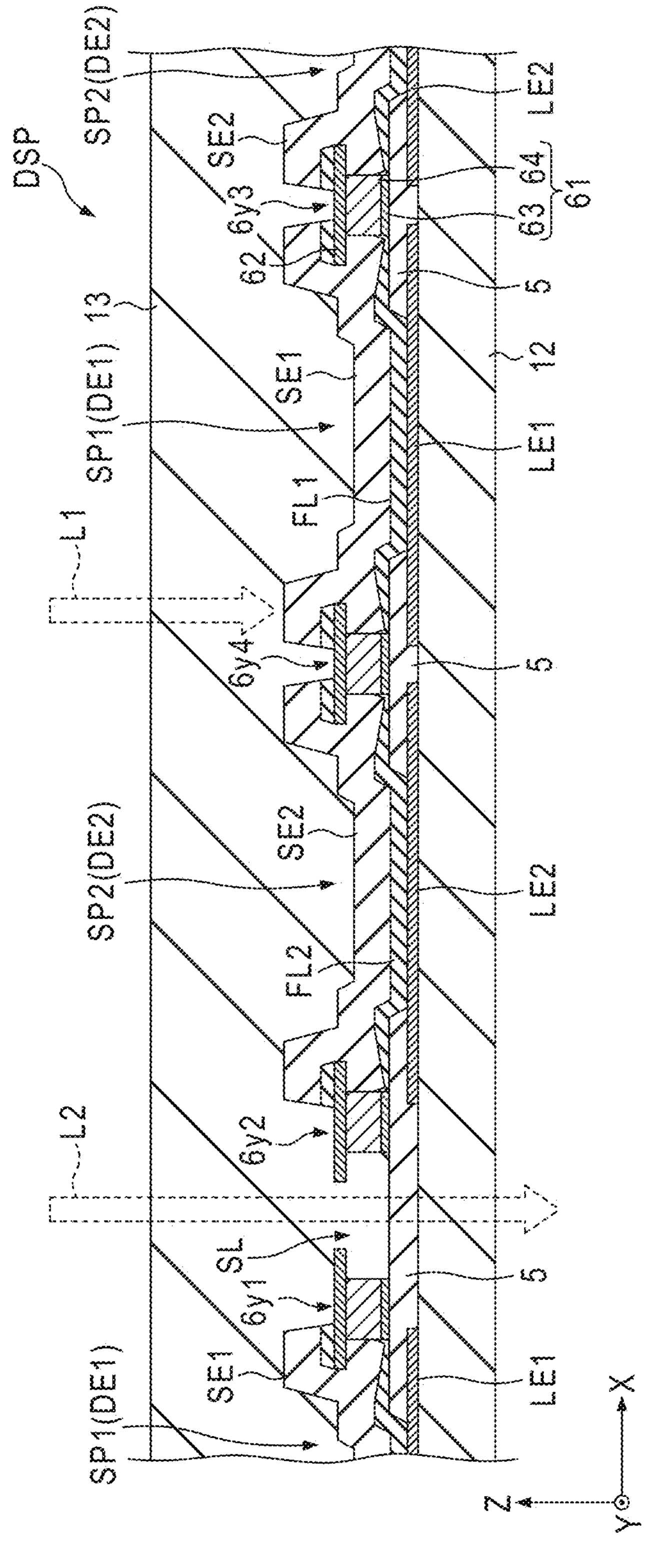
FIG. 10 is a schematic cross-sectional view of the display device along the X-X line of FIG. 9.

FIG. 9 is a schematic plan view in which two segments SG which are adjacent to each other via a slit SL are enlarged in a display device DSP according to the second embodiment. FIG. 10 is a schematic cross-sectional view of the display device DSP along the X-X line of FIG. 9.

In a manner similar to that of the first embodiment, a partition 6 includes a first partition 6*y*1, a second partition 6*y*2, a third partition 6*y*3 and a fourth partition 6*y*4. However, in this embodiment, width Wy3 of the third partition 6*y*3 is less than the total width of the first partition 6*y*1, the second partition 6*y*2 and the slit SL (Wy1+Wy2+Ws>Wy3). For example, widths Wy1, Wy2, Wy3 and Wy4 are equal to each other. Width Wy3 is, for example, greater than width Ws. However, the configuration is not limited to this example.

In the configuration of this embodiment, the interval between pixels PX1 and PX2 in an X-direction is greater than the interval between pixels PX2 and PX3 in the X-direction. Thus, when an image is displayed, streaks along the slit SL could be seen. To solve this problem, it is preferable that such streaks should be prevented by adjusting the luminance of pixels PX adjacent to the slit SL. For example, the luminance of subpixels SP1, SP2 and SP3 included in each pixel PX (pixel PX1, PX2, etc.,) adjacent to the slit SL may be made higher than that of subpixels SP1, SP2 and SP3 included in pixels PX (third pixel PX3, etc.,) which are not adjacent to the slit.

Third Embodiment

Figure 11:
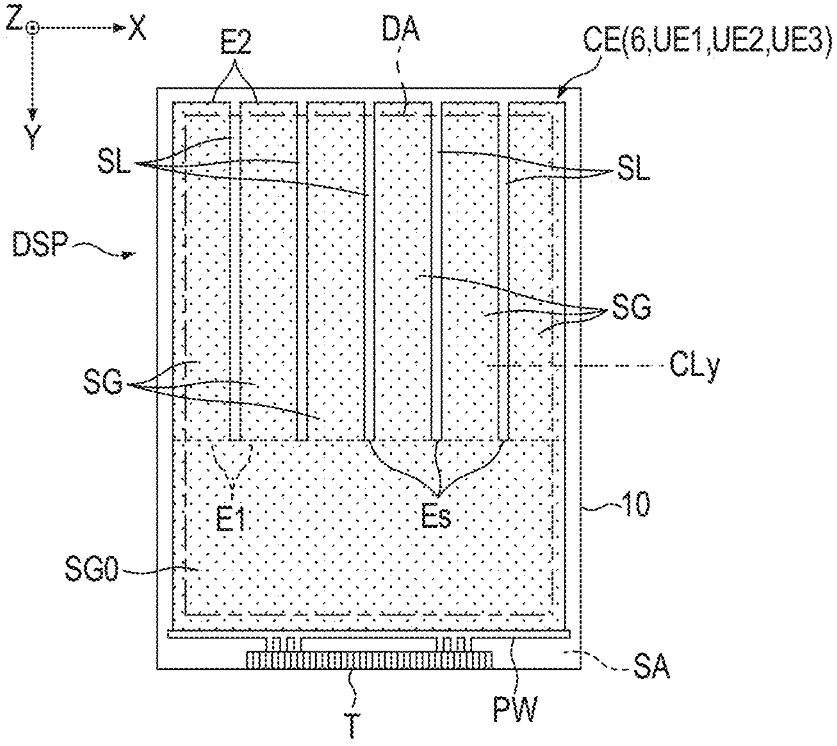
FIG. 11 is a schematic plan view showing some elements of a display device according to a third embodiment.

FIG. 11 is a schematic plan view showing some elements of a display device DSP according to the third embodiment. In the example of this figure, in a manner similar to that of the first embodiment, a plurality of slits SL extending in a Y-direction are provided in a common electrode CE, and by this configuration, the common electrode CE is divided into a plurality of segments SG arranged in an X-direction.

However, in the example of FIG. 11, the end portion Es of each slit SL on the power supply line PW side does not reach the outer edge of the common electrode CE. By this configuration, a segment SG0 having a width greater than the width of each segment SG in the X-direction is formed between the segments SG and the power supply line PW.

An end of the segment SG0 in the Y-direction is connected to the first end portions E1 of the segments SG. The other end of the segment SG0 in the Y-direction is connected to the power supply line PW.

In the example of FIG. 11, the positions of the end portions Es of the slits SL in the Y-direction are aligned with each other. Further, these end portions Es are located on the power supply line PW side relative to the center CLy of the common electrode CE in the Y-direction. The configuration is not limited to this example. The positions of the end portions Es in the Y-direction may be misaligned with each other. The end portions Es may be located on the second end portion E2 side relative to the center CLy.

Even when the slits SL do not completely divide the common electrode CE as in the case of this embodiment, it is possible to obtain an effect of preventing the eddy current described above and an effect of improving the transmittance of the display device DSP.

Fourth Embodiment

Each of the embodiments described above discloses a configuration in which each slit SL extends in a Y-direction. The fourth embodiment discloses a configuration in which each slit SL extends in an X-direction.

Figure 12:
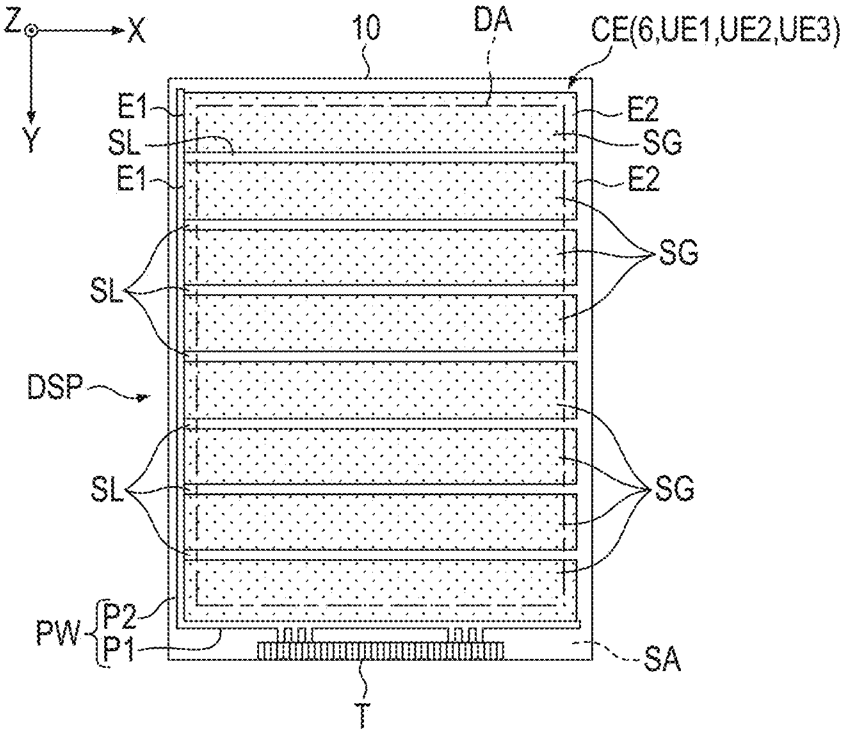
FIG. 12 is a schematic plan view showing some elements of a display device according to a fourth embodiment.

FIG. 12 is a schematic plan view showing some elements of a display device DSP according to the fourth embodiment. In the example of this figure, a plurality of slits SL extending in the X-direction are provided in a common electrode CE, and by this configuration, the common electrode CE is divided into a plurality of segments SG arranged in the Y-direction. From another viewpoint, in this embodiment, the slits SL extend parallel to the scanning lines G shown in FIG. 1.

In the example of FIG. 12, the both ends of each slit SL in the X-direction reach the outer edge of the common electrode CE. As another example, in a manner similar to that of the third embodiment, an end of each slit SL in the X-direction may not reach the outer edge of the common electrode CE.

The segments SG have a shape which is elongated in the X-direction and are arranged in the Y-direction. In FIG. 12, the widths of the segments SG in the Y-direction (the intervals of the slits SL) are equal to each other. However, the configuration is not limited to this example.

A power supply line PW has a first portion P1 extending in the X-direction and a second portion P2 extending in the Y-direction. The first portion P1 is located between a display area DA and a terminal portion T. The second portion P2 is provided along the left side of the display area DA in the figure and is connected to the first portion P1.

Each segment SG has a first end portion E1 and a second end portion E2 in the X-direction (the extension direction of the slits SL). The first end portion E1 of each of the segments SG is connected to the second portion P2.

Figure 13:
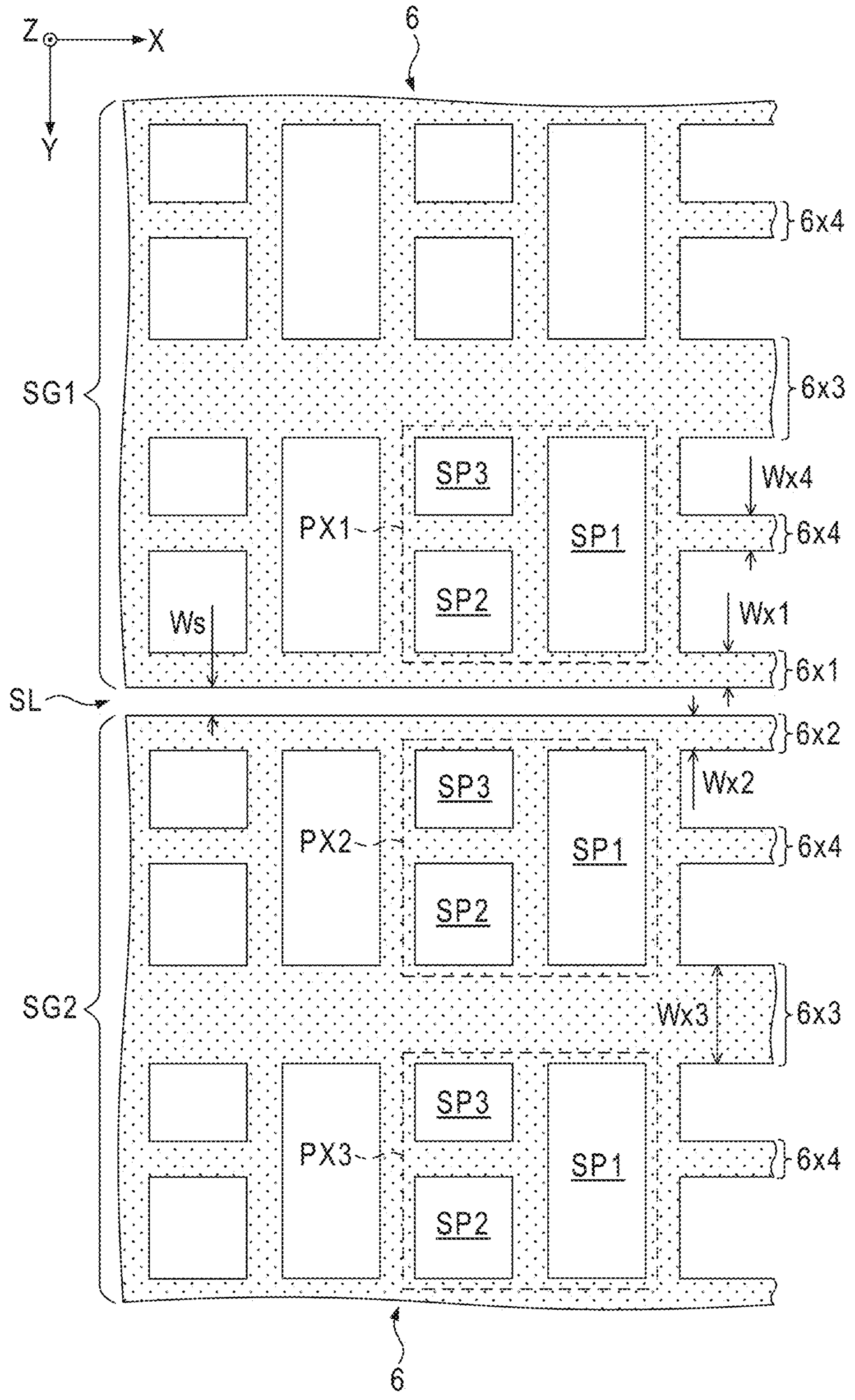
FIG. 13 is a schematic plan view in which two segments which are adjacent to each other via a slit are enlarged in the fourth embodiment.

FIG. 13 is a schematic plan view in which two segments SG which are adjacent to each other via a slit SL are enlarged according to the embodiment. In this embodiment, the segment SG located on the upper side of the slit SL in FIG. 13 is called a first segment SG1, and the segment SG located on the lower side is called a second segment SG2.

In the first segment SG1, a pixel PX which is adjacent to the slit SL is called a first pixel PX1. In the second segment SG2, two pixels PX which are aligned with pixel PX1 in the Y-direction are called a second pixel PX2 and a third pixel PX3.

The slit SL is located between subpixels SP1 and SP2 of the first segment SG1 and subpixels SP1 and SP3 of the second segment SG2. These subpixels SP1, SP2 and SP3 which are adjacent to the slit SL are surrounded by a partition 6 in a manner similar to that of the other subpixels SP1, SP2 and SP3 which are not adjacent to the slit SL.

The partition 6 includes first and second partitions 6*x*1 and 6*x*2 located between the first pixel PX1 and the second pixel PX2, and a third partition 6*x*3 located between the second pixel PX2 and the third pixel PX3. The first partition 6*x*1 extends in the X-direction along the first pixel PX1. The second partition 6*x*2 extends in the X-direction along the second pixel PX2. The first partition 6*x*1 and the second partition 6*x*2 are spaced apart from each other via the slit SL. The third partition 6*x*3 extends in the X-direction between the second pixel PX2 and the third pixel PX3. The third partition 6*x*3 is continuously formed in the Y-direction between the second pixel PX2 and the third pixel PX3 without being divided by any slit.

The partition 6 further includes a plurality of fourth partitions 6*x*4 extending in the X-direction. In each of pixels PX1, PX2 and PX3, the fourth partition 6*x*4 is located between subpixel SP2 and subpixel SP3. The fourth partitions 6*x*4 are not divided by any slit in a manner similar to that of the third partition 6*x*3.

In the Y-direction, the first partition 6*x*1 has width Wx1, and the second partition 6*x*2 has width Wx2, and the third partition 6*x*3 has width Wx3, and each fourth partition 6*x*4 has width Wx4, and the slit SL has width Ws. Here, widths Wx1, Wx2, Wx3 and Wx4 are the widths of the upper portions 62 of the partitions 6x1, 6x2, 6x3 and 6x4, respectively, in the Y-direction. Width Ws is the distance between the end portions of the upper portions 62 of the partitions 6x1 and 6x2 in the Y-direction. In the example of FIG. 13, width Wx3 is greater than each of widths Wx1, Wx2 and Wx4 (Wx1, Wx2, Wx4<Wx3). Widths Wx1, Wx2 and Wx4 are, for example, equal to each other.

Further, in the example of FIG. 13, width Wx3 is equal to the total width of the first partition 6x1, the second partition 6x2 and the slit SL (Wx1+Wx2+Ws=Wx3). By this configuration, the interval between pixels PX1 and PX2 in the Y-direction is coincident with the interval between pixels PX2 and PX3 in the Y-direction.

For example, width Ws is less than each of widths Wx1, Wx2, Wx3 and Wx4 (Ws<Wx1, Wx2, Wx3, Wx4). However, width Ws may be equal to at least one of widths Wx1, Wx2 and Wx4 or may be greater than at least one of widths Wx1, Wx2 and Wx4.

Figure 14:
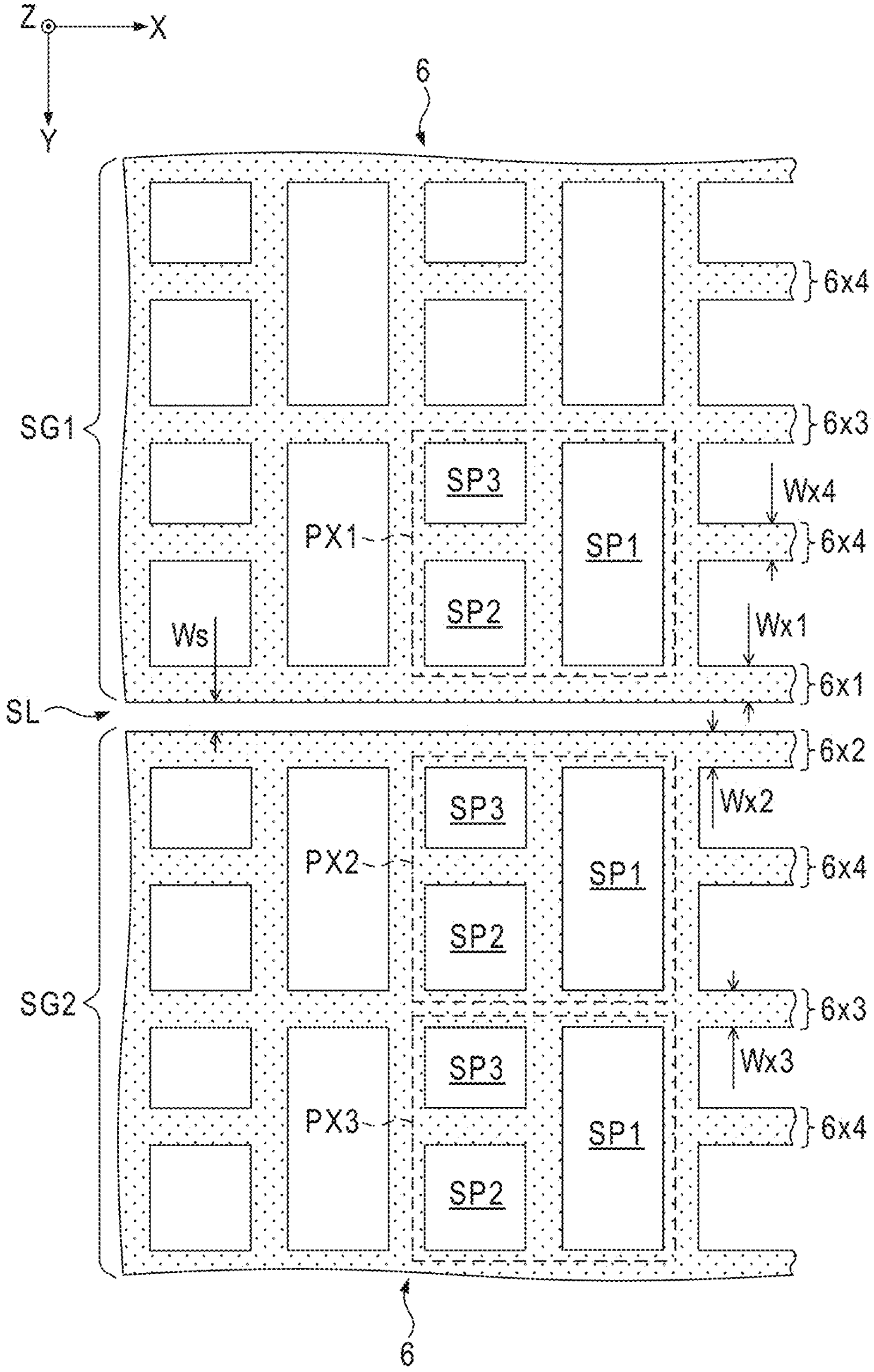
FIG. 14 is a schematic plan view showing another example which could be applied to the display device according to the fourth embodiment.

FIG. 14 is a schematic plan view showing another example which could be applied to the display device DSP according to the embodiment, and shows an enlarged view of two segments SG which are adjacent to each other via the slit SL in a manner similar to that of FIG. 13. In the example of this figure, width Wx3 of the third partition 6x3 is less than the total width of the first partition 6x1, the second partition 6x2 and the slit SL (Wx1+Wx2+Ws>Wx3). For example, widths Wx1, Wx2, Wx3 and Wx4 are equal to each other. Width Wx3 is, for example, greater than width Ws. However, the configuration is not limited to this example.

In the configuration of FIG. 14, the interval between pixels PX1 and PX2 in the Y-direction is greater than the interval between pixels PX2 and PX3 in the Y-direction. Thus, when an image is displayed, streaks along the slit SL could be seen. To solve this problem, in a manner similar to that of the second embodiment, it is preferable that such streaks should be prevented by adjusting the luminance of pixels PX adjacent to the slit SL.

Even when the slit SL extends parallel to the X-direction (the extension direction of the scanning lines G) as in the case of this embodiment, it is possible to obtain an effect of preventing the eddy current described above and an effect of improving the transmittance of the display device DSP.

Fifth Embodiment

Figure 15:
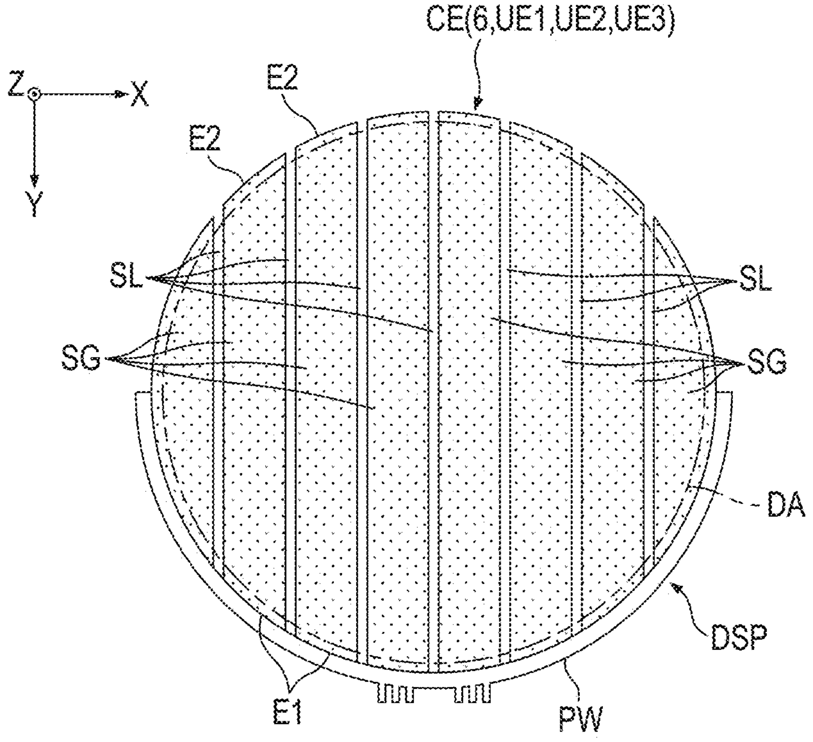
FIG. 15 is a schematic plan view showing some elements of a display device according to a fifth embodiment.

FIG. 15 is a schematic plan view showing some elements of a display device DSP according to the fifth embodiment. In this embodiment, a display area DA and a common electrode CE are circular.

In the example of FIG. 15, the common electrode CE is divided into a plurality of segments SG by a plurality of slits SL. Each slit SL extends parallel to a Y-direction. The both ends of each slit SL in the Y-direction reach the outer edge of the common electrode CE. The segments SG have a shape which is elongated in the Y-direction and are arranged in an X-direction. In FIG. 15, the widths of the segments SG in the X-direction (the intervals of the slits SL) are equal to each other. However, the configuration is not limited to this example.

Figure 16:
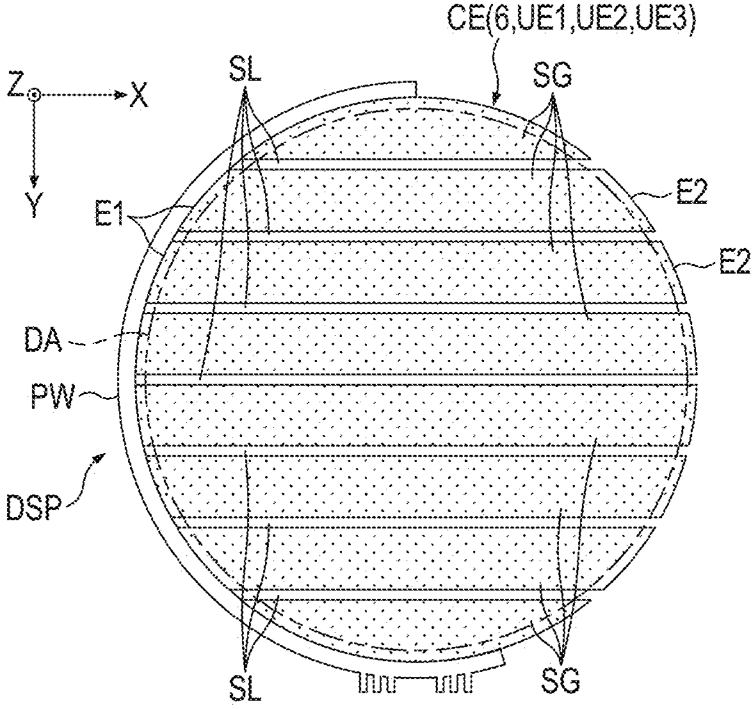
FIG. 16 is a schematic plan view showing another example which could be applied to the display device according to the fifth embodiment.

FIG. 16 is a schematic plan view showing another example of a configuration which could be applied to the display device DSP according to the embodiment. In the example of this figure, each slit SL extends parallel to the X-direction. The both ends of each slit SL in the X-direction reach the outer edge of the common electrode CE. The segments SG have a shape which is elongated in the X-direction and are arranged in the Y-direction. In FIG. 16, the widths of the segments SG in the Y-direction (the intervals of the slits SL) are equal to each other. However, the configuration is not limited to this example.

In both of the examples of FIG. 15 and FIG. 16, a power supply line PW has a planar shape which is arcuate along the display area DA. The first end portion E1 of each segment SG is connected to the power supply line PW.

In the example of FIG. 15, a configuration which is similar to that of FIG. 5 or FIG. 9 could be applied to the vicinity of each slit SL. In the example of FIG. 16, a configuration which is similar to that of FIG. 13 or FIG. 14 could be applied to the vicinity of each slit SL. In a manner similar to that of the third embodiment, the end portion of each slit SL on the power supply line PW side may not reach the outer edge of the common electrode CE.

Sixth Embodiment

In the examples of FIG. 4, FIG. 11, FIG. 12, FIG. 15 and FIG. 16, the segments of the common electrode CE have the same widths in the arrangement direction of these segments (in other words, a direction orthogonal to the extension direction of the slits). The sixth embodiment exemplarily shows a configuration in which the widths of these segments are different from each other. The configuration disclosed in each of the embodiments described above can be also appropriately applied to this embodiment.

Figure 17:
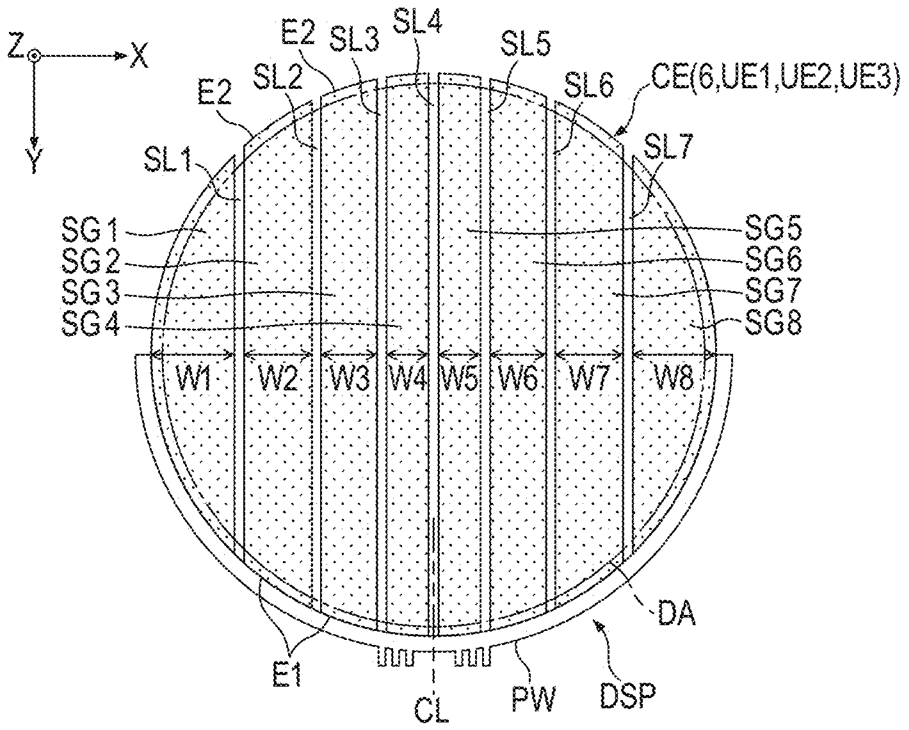
FIG. 17 is a schematic plan view showing some elements of a display device according to a sixth embodiment.

FIG. 17 is a schematic plan view showing some elements of a display device DSP according to the sixth embodiment. In the example of this figure, a common electrode CE is divided into eight segments SG (segments SG1 to SG8) arranged in an X-direction by seven slits SL (slits SL1 to SL7) extending parallel to a Y-direction. In this case, the Y-direction corresponds to the extension direction of the slits SL1 to SL7, and the X-direction corresponds to the arrangement direction of the segments SG1 to SG8.

In the example of FIG. 17, in a manner similar to that of the fifth embodiment, a display area DA and the common electrode CE are circular. In other words, the common electrode CE has a planar shape in which the width in the extension direction of the slits SL1 to SL7 decreases with increasing distance from the center CL in the arrangement direction of the segments SG1 to SG8. A similar configuration is applied to the planar shape of the display area DA. It should be noted that this configuration of the display area DA and the common electrode CE could be realized even in the case of other planar shapes such as an oval.

In the example of FIG. 17, the segments SG1 and SG8 are the farthest from the center CL, and the segments SG4 and SG5 are the closest to the center CL. For example, the center CL is located between the segments SG4 and SG5 and overlaps the slit SL4.

The segments SG1 to SG8 have widths W1 to W8, respectively, in the X-direction. These widths W1 to W8 correspond to, for example, the maximum widths of the segments SG1 to SG8 in the X-direction.

Here, the numbers of pixels PX overlapping the segments SG1 to SG8 are defined as the numbers Pn1 to Pn8 of overlapping pixels, respectively. If each of the display area DA and the common electrode CE has the planar shape shown in FIG. 17, and further, widths W1 to W8 are equal to each other, the numbers Pn1 to Pn8 of overlapping pixels are nonuniform. More specifically, the numbers Pn4 and Pn5 of overlapping pixels are the greatest. The numbers Pn3 and Pn6 of overlapping pixels are the second greatest. The numbers Pn2 and Pn7 of overlapping pixels are the third greatest. The numbers Pn1 and Pn8 of overlapping pixels are the least.

The common voltage of the segments SG1 to SG8 tend to decrease as the number of overlapping pixels increases. When the common voltage decreases, the luminance of subpixels SP1, SP2 and SP3 decreases. Thus, an undesired luminance gradient based on the number of overlapping pixels could be generated in the display area DA.

This luminance gradient can be prevented by differentiating at least some of widths W1 to W8 from each other so as to reduce the difference in the numbers Pn1 to Pn8 of overlapping pixels. Specifically, when a first segment (one of the segments SG1 to SG8) which is spaced apart from the center CL is compared with a second segment (another one of the segments SG1 to SG8) which is closer to the center CL than the first segment, the width of the first segment should be preferably greater than that of the second segment. By this configuration, the difference in the number of overlapping pixels between the first segment and the second segment is reduced. As a result, the difference in the luminances of areas corresponding to these segments is also reduced.

In the example of FIG. 17, widths W1 and W8 are the greatest. Widths W2 and W7 are the second greatest. Widths W3 and W6 are the third greatest. Widths W4 and W5 are the least. By this configuration, the difference in the numbers Pn1 to Pn8 of overlapping pixels is reduced as a whole.

Widths W1 to W8 should be preferably determined such that the difference in the number of overlapping pixels between adjacent two segments of the segments SG1 to SG8 is within 10%. In addition, widths W1 to W8 should be preferably determined such that the difference between the number of overlapping pixels in the segment having the greatest area among the segments SG1 to SG8 and the number of overlapping pixels in the segment having the least area is within 30%. Here, the phrase "the difference in the number of overlapping pixels is within XX %" means that the difference in the number of overlapping pixels is included in the range of −XX % to +XX % of the less number of overlapping pixels of the two numbers of overlapping pixels.

The resistances of the segments SG1 to SG8 change based on the shapes of the segments SG1 to SG8, the form of connection to a power supply line PW, etc. These resistances could also cause common voltage to differ in the segments SG1 to SG8. Therefore, widths W1 to W8 may be determined in consideration of the resistances of the segments SG1 to SG8 in addition to the number of overlapping pixels.

Specifically, the decrease ΔV in the common voltage in a segment is proportional to the product (Pn×R) of the number Pn of overlapping pixels and resistance R of the segment. Thus, widths W1 to W8 could be determined such that the products (Pn×R) with respect to the respective segments SG1 to SG8 are considered to be substantially equal to each other. It should be noted that the phrase "substantially equal to each other" includes a case where the target values to be compared with each other have a difference of, for example, several percent, in addition to a case where the values are coincident with each other.

Figure 18:
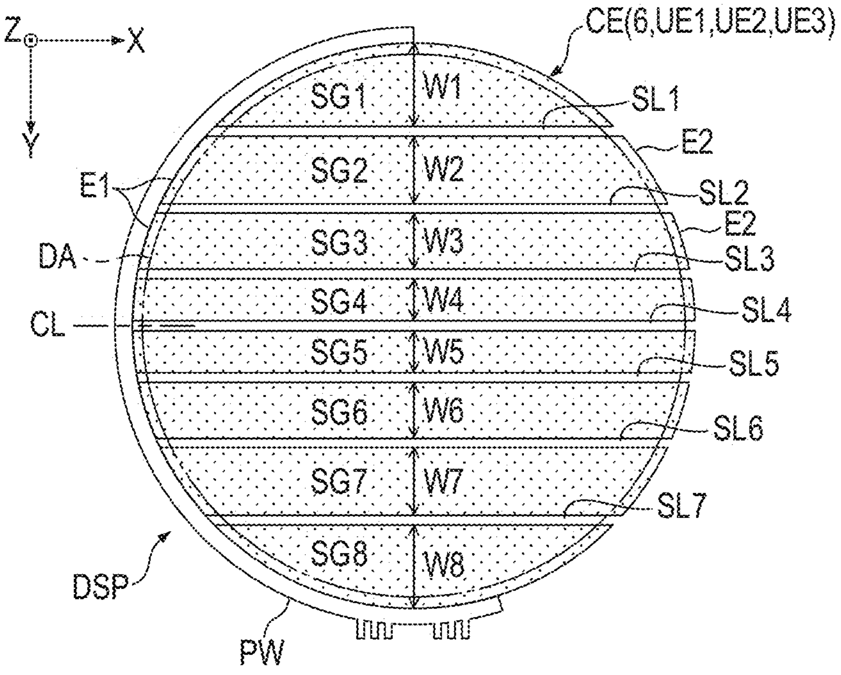
FIG. 18 is a schematic plan view showing another example of the display device according to the sixth embodiment.

FIG. 18 is a schematic plan view showing another example of the display device DSP according to the embodiment. In this figure, in a manner similar to that of FIG. 17, the display area DA and the common electrode CE are circular. However, the common electrode CE is divided into segments SG1 to SG8 arranged in the Y-direction by slits SL1 to SL7 extending parallel to the X-direction. In this case, the X-direction corresponds to the extension direction of the slits SL1 to SL7, and the Y-direction corresponds to the arrangement direction of the segments SG1 to G8. In this configuration, in a manner similar to that of the example of FIG. 17, the difference in the luminance of the display area DA can be made uniform by adjusting widths W1 to W8 of the segments SG1 to SG8.

Figure 19:
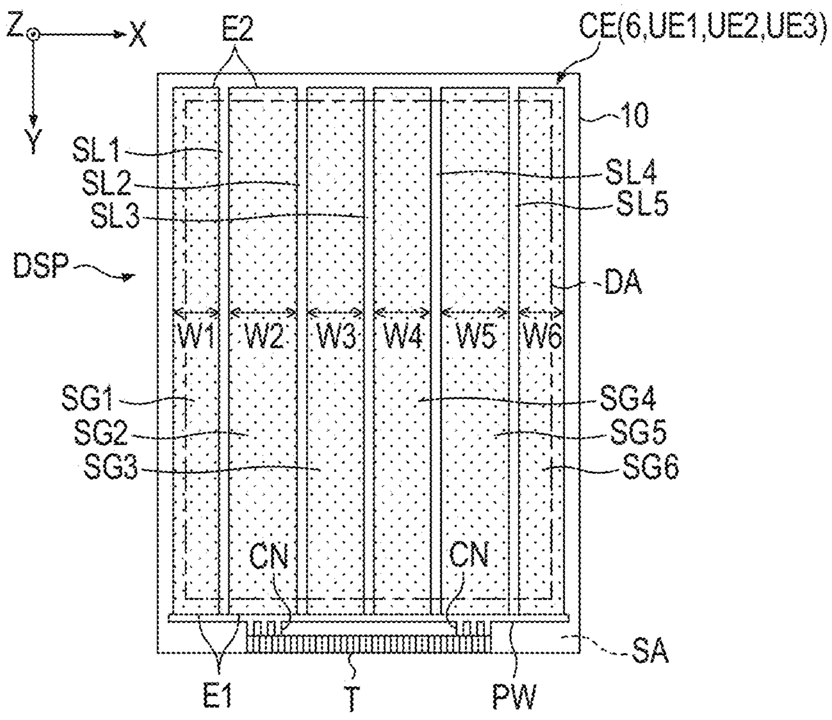
FIG. 19 is a schematic plan view showing yet another example of the display device according to the sixth embodiment.

FIG. 19 is a schematic plan view showing yet another example of the display device DSP according to the embodiment. In this figure, in a manner similar to that of the first embodiment (FIG. 4), the planar shapes of the display area DA and the common electrode CE are rectangular. Further, the common electrode CE is divided into segments SG1 to SG6 arranged in the X-direction by slits SL1 to SL5 extending parallel to the Y-direction.

A terminal portion T provided in a surrounding area SA includes a terminal for applying common voltage to the display device DSP. The power supply line PW is connected to the terminal portion T including the terminal via connection portions CN. In the example of FIG. 19, two connection portions CN are provided near the segments SG2 and SG5, respectively.

The common voltages of the segments SG1 to SG6 differ depending on the locational relationship with the connection portions CN. Specifically, the common voltage of a segment which is distant from the connection portions CN could be decreased compared to the common voltage of a segment which is close to the connection portions CN.

The luminance gradient which is generated by this decrease in common voltage can be prevented by differentiating at least some of widths W1 to W6 of the segments SG1 to SG6 from each other. Specifically, when a first segment having a long distance from the connection portions CN along the power supply line PW is compared with a second segment having a shorter distance from the connection portions CN along the power supply line PW than the first segment, the width of the first segment should be preferably less than that of the second segment. From another view point, the number of overlapping pixels in the first segment should be preferably less than that in the second segment. By this configuration, the decrease in the voltage of the first segment is prevented, and further, the difference in the luminances of areas corresponding to the first segment and the second segment is also reduced.

In the example of FIG. 19, widths W2 and W5 of the segments SG2 and SG5 close to the connection portions CN are the greatest. Widths W1 and W6 of the segments SG1 and SG6 located at the both ends of the display area DA are the least. Widths W3 and W4 of the segments SG3 and SG4 located between two connection portions CN in the X-direction are greater than widths W1 and W6 and less than widths W2 and W5.

Figure 20:
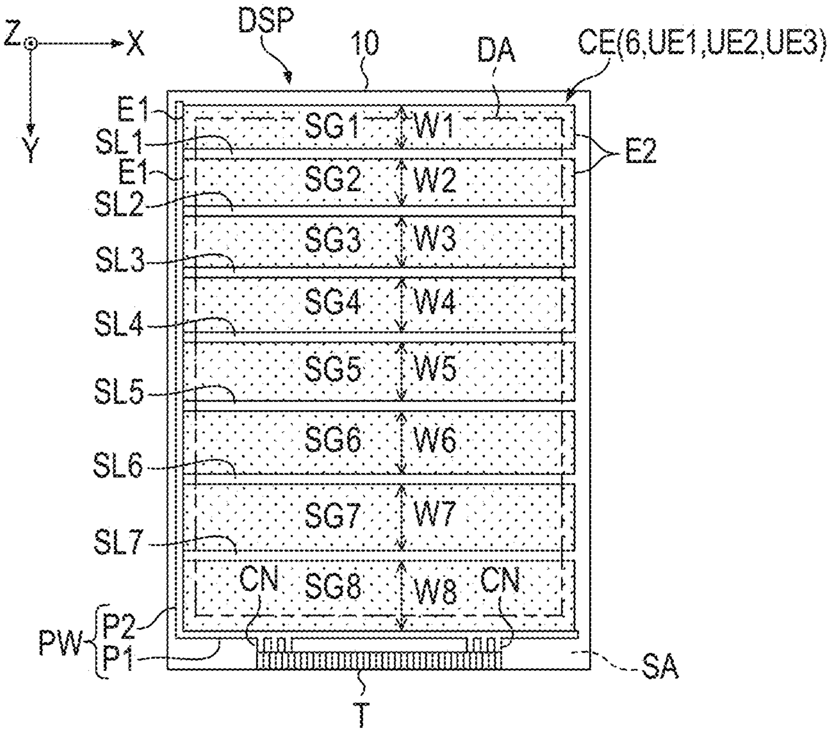
FIG. 20 is a schematic plan view showing yet another example of the display device according to the sixth embodiment.

FIG. 20 is a schematic plan view showing yet another example of the display device DSP according to the embodiment. In this figure, in a manner similar to that of FIG. 19, the display area DA and the common electrode CE are rectangular. However, the common electrode CE is divided into segments SG1 to SG8 arranged in the Y-direction by slits SL1 to SL7 extending parallel to the X-direction. In this case, the X-direction corresponds to the extension direction of the slits SL1 to SL7, and the Y-direction corresponds to the arrangement direction of the segments SG1 to G8.

In a manner similar to that of the fourth embodiment (FIG. 12), the power supply line PW has a first portion P1 extending in the X-direction and a second portion P2 extending in the Y-direction. The first portion P1 is connected to the connection portions CN. The second portion P2 is connected to the first end portions E1 of the segments SG1 to SG8.

In this configuration, the segment SG1 is the farthest from the connection portions CN along the power supply line PW, and the segment SG8 is the closest to the connection portions CN along the power supply line PW. Accordingly, in the example of FIG. 20, the slits SL1 to SL7 are provided such that widths W1 to W8 of the segments SG1 to SG8 increase in order.

The configurations in which the widths of the segments are differentiated based on the distance from the connection portions CN as explained with reference to FIG. 19 and FIG. 20 can be also applied to the examples of FIG. 17 and FIG. 18.

Other than the configurations of FIG. 17 to FIG. 20 exemplarily shown in the embodiment, the widths of the segments of the common electrode CE may be differentiated from each other in various ways. All of the segments provided in the common electrode CE may not necessarily have a width which is different from that of an adjacent segment. When at least two of a plurality of segments have different widths, an effect of preventing the luminance gradient described above can be obtained.

In the examples of FIG. 4, FIG. 11 and FIG. 19, five slits SL1 to SL5 are provided in the common electrode CE. In the examples of FIG. 12, FIG. 15 to FIG. 18 and FIG. 20, seven slits SL1 to SL7 are provided in the common electrode CE. However, the number of slits SL provided in the common electrode CE is not limited to these examples and may be two to four, six, or eight or greater. In addition, the shapes of the slits and segments could be modified in various ways.

All of the display devices that can be implemented by a person of ordinary skill in the art through arbitrary design changes to the display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:

first, second and third pixels each of which includes a plurality of subpixels exhibiting different colors, and which are arranged in a first direction; and a partition which includes a conductive lower portion and an upper portion protruding from a side surface of the lower portion and surrounds each of the first pixel, the second pixel and the third pixel, wherein each of the subpixels includes:

a lower electrode;

an organic layer which covers the lower electrode and emits light based on application of voltage; and an upper electrode which is in contact with the lower portion and covers the organic layer, the partition includes:

a first partition located between the first pixel and the second pixel and extending in a second direction intersecting with the first direction along the first pixel;

a second partition located between the first pixel and the second pixel and extending in the second direction along the second pixel; and a third partition located between the second pixel and the third pixel and extending in the second direction, the first partition and the second partition are spaced apart from each other in the first direction via a slit extending in the second direction, and the third partition is continuously formed between the second pixel and the third pixel.

2. The display device of claim 1, wherein a width of the third partition in the first direction is greater than a width of each of the first partition and the second partition in the first direction.

3. The display device of claim 2, wherein the width of the third partition in the first direction is equal to a total width of the first partition, the second partition and the slit in the first direction.

4. The display device of claim 1, wherein widths of the first partition, the second partition and the third partition in the first direction are equal to each other.

5. The display device of claim 1, wherein a width of the slit in the first direction is less than a width of each of the first partition and the second partition in the first direction.

6. The display device of claim 1, wherein each of the first pixel, the second pixel and the third pixel includes first and second subpixels arranged in the first direction, the partition further includes a fourth partition located between the first subpixel and the second subpixel and extending in the second direction, and a width of the fourth partition in the first direction is less than or equal to a width of the third partition in the first direction.

7. The display device of claim 6, wherein widths of the first partition, the second partition and the fourth partition in the first direction are equal to each other.

8. The display device of claim 1, further comprising:

a pixel circuit connected to the lower electrode;

a scanning line which supplies a scanning signal to the pixel circuit; and a signal line which supplies a video signal to the pixel circuit, wherein the slit extends parallel to the signal line.

9. The display device of claim 1, further comprising:

a pixel circuit connected to the lower electrode;

a scanning line which supplies a scanning signal to the pixel circuit; and a signal line which supplies a video signal to the pixel circuit, wherein the slit extends parallel to the scanning line.

10. The display device of claim 1, wherein neither the organic layer nor the upper electrode is provided in the slit.

11. The display device of claim 1, wherein each of the subpixels further comprises a sealing layer formed of an inorganic insulating material, the sealing layer continuously covers the partition and a stacked body including the organic layer and the upper electrode, and the sealing layer is not provided in the slit.

12. The display device of claim 11, further comprising a resin layer which covers the sealing layer, wherein the slit is filled with the resin layer.

13. The display device of claim 1, wherein the upper electrode and the partition constitute a common electrode which overlaps a display area in which a plurality of pixels including the first pixel, the second pixel and the third pixel are arrayed, and at least an end of the slit reaches an outer edge of the common electrode.

14. The display device of claim 13, wherein the common electrode has a plurality of segments into which the common electrode is divided by the slit, and the segments are electrically connected to each other.

15. The display device of claim 14, wherein the segments are arranged in an arrangement direction intersecting with an extension direction of the slit, and at least two of the segments have widths different from each other in the arrangement direction.

16. The display device of claim 15, wherein each of the display area and the common electrode has a planar shape in which a width in the extension direction decreases with increasing distance from a center in the arrangement direction, the segments include a first segment, and a second segment which is closer to the center than the first segment, and a width of the first segment in the arrangement direction is greater than a width of the second segment in the arrangement direction.

17. The display device of claim 16, wherein the planar shape of each of the display area and the common electrode is circular.

18. The display device of claim 15, further comprising:

a power supply line provided in a surrounding area around the display area and connected to each of the segments;

a terminal portion including a terminal for applying common voltage; and a connection portion which connects the terminal portion and the power supply line to each other, wherein the segments include a first segment and a second segment having a shorter distance from the connection portion along the power supply line than the first segment, and a width of the first segment in the arrangement direction is less than a width of the second segment in the arrangement direction.

19. The display device of claim 15, wherein a difference between a number of pixels overlapping one of adjacent two segments of the plurality of segments and a number of pixels overlapping the other segment is within 10%.

20. The display device of claim 15, wherein a difference between a number of pixels overlapping a segment having a greatest area among the plurality of segments and a number of pixels overlapping a segment having a least area among the plurality of segments is within 30%.

* * * * *